United States Patent [19]

Rapeli et al.

[11] 4,408,170

[45] Oct. 4, 1983

[54] COMPONENT WITH TRIMMABLE ELECTRIC IMPEDANCE

[76] Inventors: Juha Rapeli, Kuikkatie 4 E 6, 90150 Oulu 15; Seppo Leppävuori, Hiukkavaarantie 1 A 9, 90650 Oulu 65, both of Finland

[21] Appl. No.: 315,533
[22] PCT Filed: Mar. 11, 1981
[86] PCT No.: PCT/FI81/00017
 § 371 Date: Oct. 23, 1981
 § 102(e) Date: Oct. 23, 1981
[87] PCT Pub. No.: WO81/02652
 PCT Pub. Date: Sep. 17, 1981

[30] Foreign Application Priority Data

Mar. 11, 1980 [FI] Finland ................................. 800740

[51] Int. Cl.³ .......................... H03H 1/02; H03H 3/00
[52] U.S. Cl. ...................................... 333/172; 29/620; 333/185
[58] Field of Search ............ 333/172, 167, 185, 81 R; 29/620, 610 R, 619

[56] References Cited

U.S. PATENT DOCUMENTS

| | | | |
|---|---|---|---|
| 3,109,983 | 11/1963 | Cooper et al. | 333/172 X |
| 3,542,654 | 11/1970 | Orr | 333/172 X |
| 3,569,872 | 3/1971 | Berlin | 333/172 |
| 3,665,346 | 5/1972 | Orr | 333/172 |
| 3,686,591 | 8/1972 | Gikow | 333/167 |

*Primary Examiner*—Marvin L. Nussbaum
*Attorney, Agent, or Firm*—McGlew and Tuttle

[57] ABSTRACT

An electric component is disclosed with trimmable complex resistive-capacitive impedance comprising a first resistor layer forming a ground plane, an insulation layer connected thereover and a second resistor layer connected over the insulation layer. The second resistor layer is divided into a plurality of resistor layer portions. The resistor layer has one edge which is attached to a power drive connector and an opposite edge which is step shaped so that the resistor layer portions are varied both in length and in width. The resistor layer portions are selectively connected and disconnected from each other to produce a desired impedance value.

10 Claims, 15 Drawing Figures

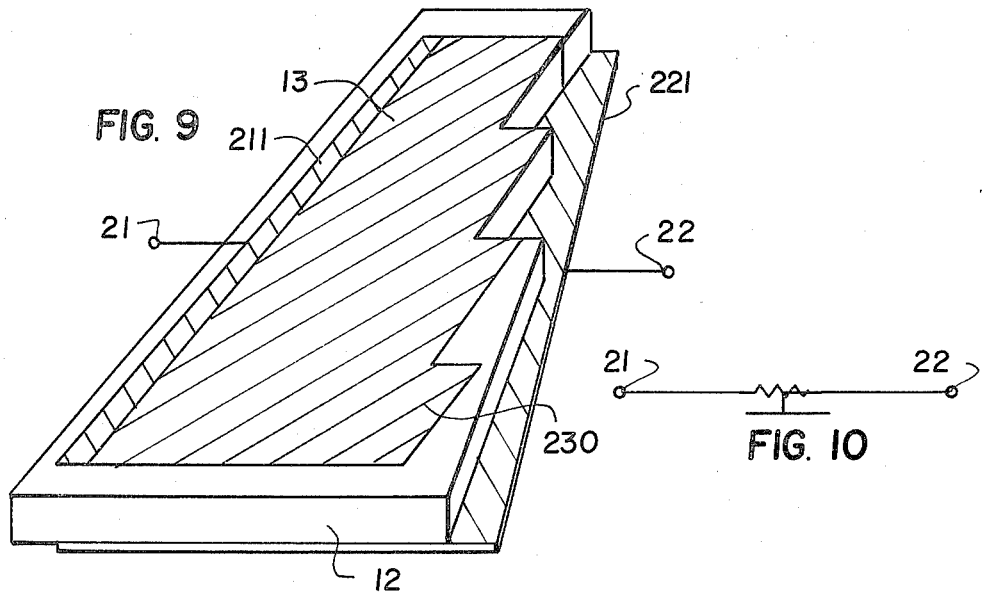
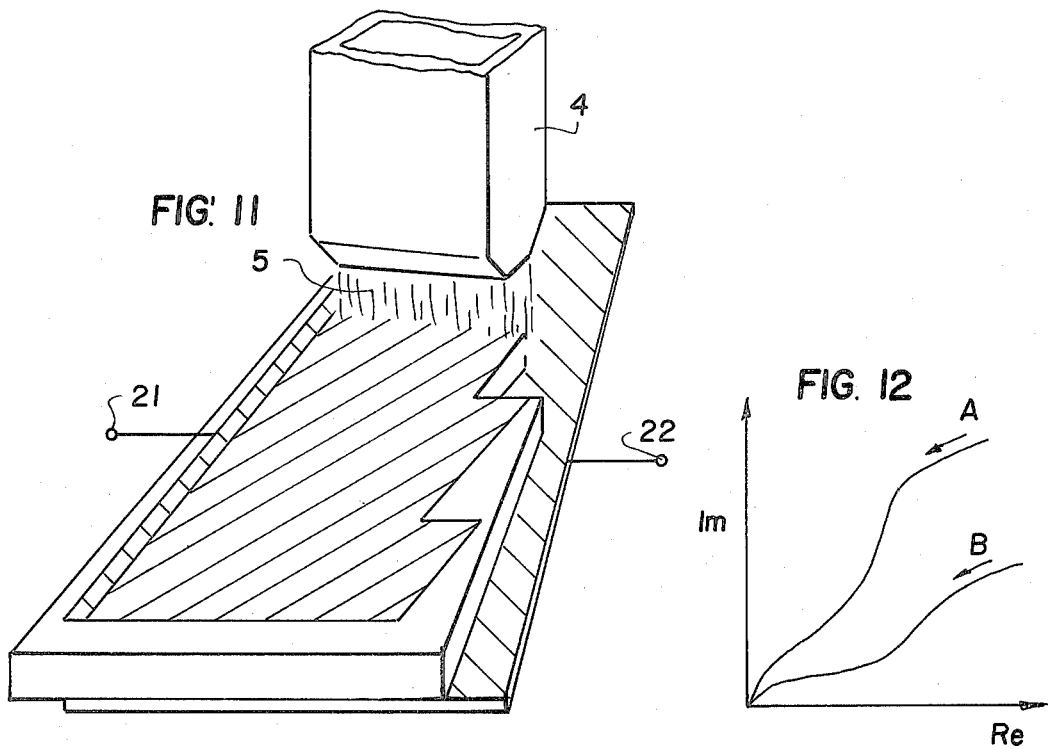

COMPONENT WITH TRIMMABLE ELECTRIC IMPEDANCE

FIELD AND BACKGROUND OF THE INVENTION

The invention declared herein is an electric component comprising of distributed RC-structures and having a trimmable resistive-capacitance impedance, i.e. a trimmable complex impedance device or a stub.

Resistors, capacitors and inductances which are trimmable electric components are known in the prior art. To realize a complex impedance, parallel or series connections of the above mentioned components or distributed RC-structures have been used. However, a trimmable complex impedance has not yet been presented and trimming, where necessary, is carried out by successive trimmings of a resistor and a capacitor connected in parallel or in series, the trimmings taking place at different points of time.

Since modern electronic circuits are often realized as integrated film circuits such as thick film and thin film circuits, where only one component can be trimmed at a time, only permanently and only in one direction, the trimming of a complex impedance or, in general, the trimming of an electric circuit by changing the complex impedance thereof, is very difficult. That is the reason for aiming, already during the design stage, at solutions where a desired characteristic feature of the circuit could be adjusted by trimming only the resistor, that is to say, the resistive impedance.

The distributed RC-structure which is used in the present invention has been presented, for example, in an article by W. M. Kaufman: "Theory of a Monolithic Null Device and Some Novel Circuits", pp. 1540–1545, Proc. IRE, September 1960, and in the British Pat. No. 1,149,764.

The British Patent deals with two notch circuits. In this context, however, the trimming of a complex impedance cannot be learned. The first notch filter consists of a coaxial transmission line, to which a grounding resistor has been connected. A good conductor in the middle of the coaxial transmission line is encircled by an insulation layer which in turn is encircled by a resistive outer layer. The notch is trimmed by shortening the transmission line gradually until the desired notch-frequency is achieved.

It is pointed out in the same patent that a planar structure can be used instead of the coaxial transmission line. It must be noticed, however, that the notch described above cannot be manufactured at an exact frequency because of the statistical divergence of the RC-product of the RC-structure formed by the transmission line. Besides, the trimming must take place before the attaching of the connecting wires.

The above mentioned British Patent also discloses a trimmerlike, adjustable notch filter. Therein the values of the two components, the resistive-capacitive and the resistive ones, can be adjusted reversibly and in parallel by using a slide. However, the manufacturing of such a circuit is difficult because the demanded ratio 17.8 between the resistivities of the components cannot be realized in a satisfactory manner. Thus, the circuit does not function in the desired way. It would also be impossible to use such a circuit in integrated circuits.

Various kinds of electric circuits are presented in the U.S. Patent 3,109,983. The production of these circuits has not been practical because the manufacture divergence of their distributed RC-structures cannot be eliminated by trimming only the resistor or the capacitor. The trimmable impedance device of the present invention allows for the practical manufacturing of these circuits, as well, which fact has been confirmed by various experiments.

Clearly, there is a need for a component, in which both the resistive and the capacitive parts of the impedance are changed simultaneously in a fully predictable way and by a single trimming operation. The purpose of the present invention is to realize a component with a trimmable electric impedance, i.e. a stub. This is achieved by the characteristic features of the invention.

Before this invention it has not been possible to produce a component, the impedance of which could be trimmed in an exact and predictable way. The advantages of the inventive component are, above all, the accuracy of the trimming and the possibility to calculate the characteristics of the circuit exactly and in advance. These advantages are remarkable particularly when the component is part of an integrated circuit.

SUMMARY OF THE INVENTION

Accordingly the present invention relates to an electric component which has trimmable complex resistive-dash capacitive impedance.

An object of the invention is to provide such a component which includes a first resistor layer forming a ground plane, an insulation layer connected thereover and a second resistor layer connected over the insulation layer. The second resistor layer is divided into a plurality of resistor layer portions that are selectively connected and disconnected from each other to produce a selected resistive-capacitive impedance. The second resistive layer has one edge connected to a drive point conductor and an opposite edge which is step shaped so that the plurality of resistor layer portions are varied in length and width.

The various features of novelty which characterize the invention are pointed out with particularity in the claims annexed to and forming a part of this disclosure. For a better understanding of the invention, its operating advantages and specific objects attained by its uses, reference is made to the accompanying drawings, and descriptive matter in which preferred embodiments of the invention are illustrated.

BRIEF DESCRIPTION OF THE DRAWINGS

In the Drawings:

FIG. 9 is a perspective view showing the physical structure of a stub realized;

FIG. 10 shows the symbol for a stub;

FIG. 11 is a perspective view that shows the principle of trimming the stub;

FIG. 12 is a graph that clarifies the trimming process itself;

DESCRIPTION OF THE PREFERRED EMBODIMENTS

Figure 1:
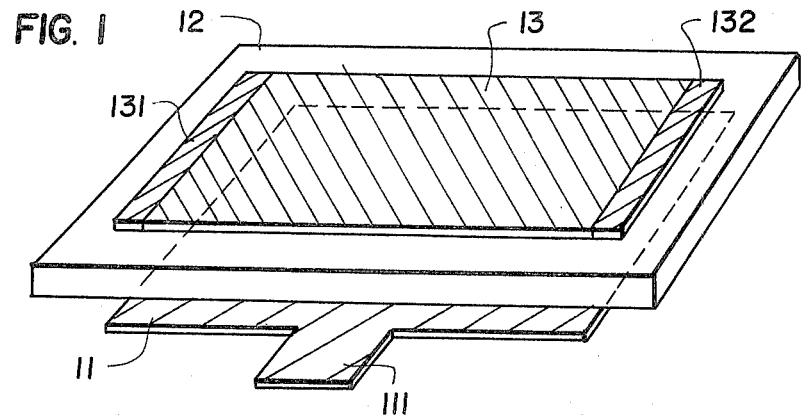
FIG. 1 is a top view of the distributed RC-structure in perspective.

The distributed RC-structure of FIG. 1, forming the basis of the stub, consists of a conductor layer or secondarily of a resistor layer 11, on top of which are placed an insulation layer 12 and a resistor layer 13 which is electrically connected with the terminating conductors 131 and 132. In most cases the film 11 is formed of a very good electric conductor. The manufacturing of this structure is generally known, and some special methods have been described, e.g. in U.S. Pat. No. 3,665,346 and in a German Patent Application No. DE 2,714,034.

Figure 2:
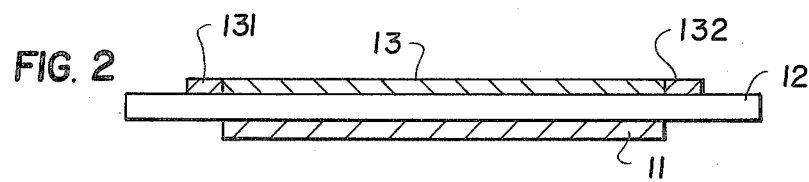
FIG. 2 is a longitudinal sectional view of the RC-structure of FIG. 1.
Figure 3:
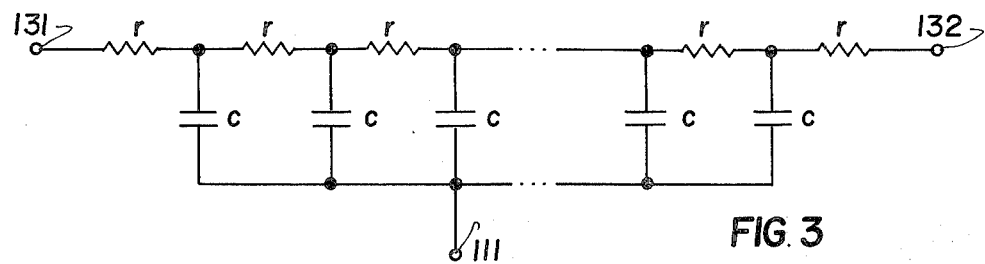
FIG. 3 is an analogous circuit diagram of the distributed RC-structure of FIGS. 1 and 2.
Figure 4:
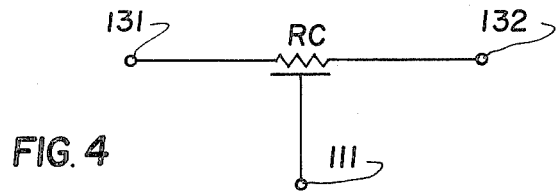
FIG. 4 shows the symbol used for the distributed RC-structure.

FIG. 2 shows the longitudinal section of the distributed RC-structure. In FIG. 3 there is shown an analogous circuit diagram of the distributed RC-structure presented in FIGS. 1 and 2. FIG. 4 represents the symbol for this structure. The layer 11 which is connected with the end conductor 111, is called a ground plane. Furthermore, the structure is called an open one, if all the end conductors 131, 132 and 111 are unconnected with each other. If one of the end conductors 131, 132 of the resistor layer 13 is connected with the ground plane 11 or with its end conductor 111, the type of the structure is referred to as short circuited.

When thin film technology is used in order to realize a distributed RC-structure, the thickness of the layers 11, 12 and 13 is in general less than one micrometer, whereas it varies between 5 and 50 micrometers when thick film technology is used.

Theoretical calculations have shown that the open distributed RC-structure can produce impedances, the phase angle whereof varying from 43 to 90 degrees. A shorted structure is able to produce impedances, the phase angle of which will vary from 0 up to 47 degrees. After the required phase angle has been achieved, the desired absolute value of the impedance can be obtained by changing the shape and the dimensions of the structures of FIG. 1. With an open structure the absolute value of the impedance decreases no more than in proportion to the increase of the frequency and no less than in proportion to the square root of the increase of the frequency. The corresponding decrease for the short circuited structure takes place in relation to the increase of the square root of the frequency at the most.

Thus one distributed RC-structure can realize one impedance and only at one frequency. An impedance of this kind cannot be trimmed. A trimmable impedance can be realized, however, by the inventive integrated connection of the distributed RC-structures, which is dealt with in the following by using the inverses if the impedances, that is, the admittances. The phase angles mentioned above are valid as such for the admittances, and the admittances increase along with the frequency in the same proportion as the impedances decrease in the above description.

Figure 5:
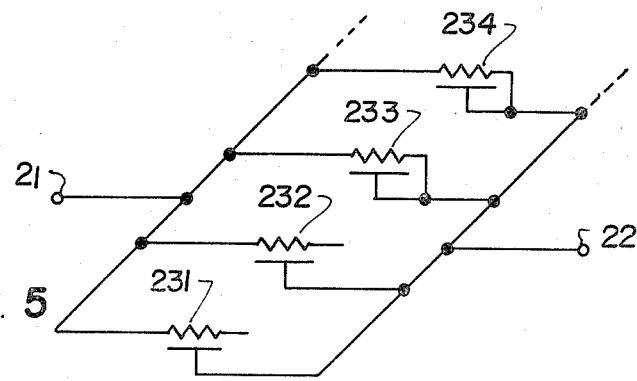
FIG. 5 is the circuit diagram for constructing the stub.

The realization of the stub is shown in FIGS. 5-9. The following is an example to clarify the method of forming a stub. Let the frequencies $f_1, f_2, f_3, f_4$, represent equal or different admittances at these frequencies are correspondingly $Y_1, Y_2, Y_3$ and $Y_4$. The distributed RC-structure 231 of FIG. 5 is realized so that its admittance at the frequency $f_1$ will be $Y_1$. Then the admittance $Y'_2$ of the structure 231 at the frequency $f_2$ are calculated. If it is smaller than the required $Y_2$ at this frequency, a distributed RC-structure 232 with suitable dimensions is added between the point 21 and 22, that is, next to the structure 231, in order to eliminate the difference $Y_2-Y'_2$. In this way, frequency-admittance pairs are realized one at a time by always taking the former structures into account, until all the frequencies have been dealt with or till the task appears impossible, which may sometimes be the case. In general, the realization of the stub is possible, if both the resistive and the capacitive part of the admittance to be realized increases or decreases along with the frequency.

Figure 6:
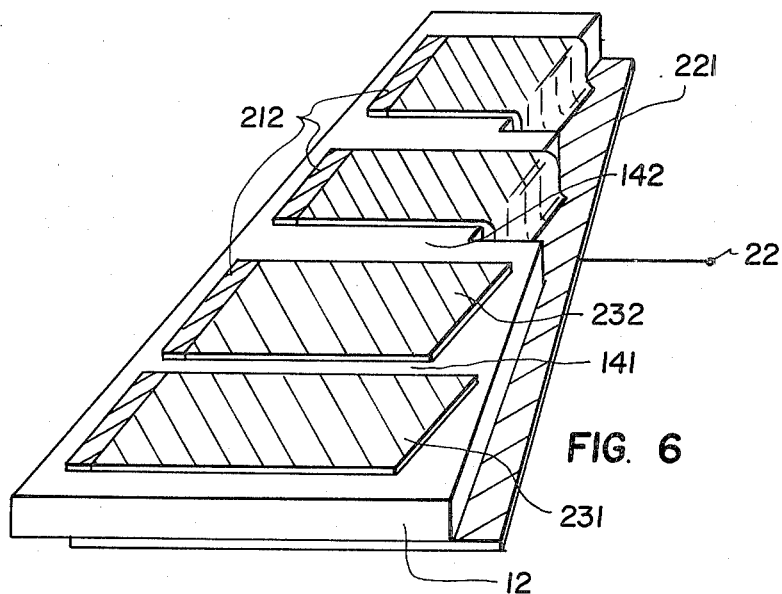
FIG. 6 is a perspective view showing the physical structure of the stub.
Figure 7:
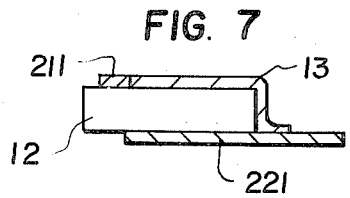
FIG. 7 is a cross-sectional drawing of a short circuited RC-structure.
Figure 8:
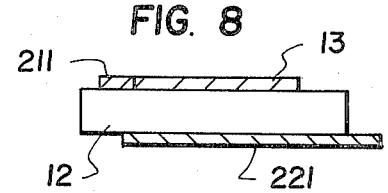
FIG. 8 is a cross-sectional drawing of an open RC-structure.

The additional structures 231, 232, 223 and 234 are either open (FIG. 8) or short circuited (FIG. 7) depending on the phase angles of their admittances. As they all have a common ground plane 221 and a common insulation layer 12, they can be prepared into a continuous structure by using the layer 221 as a ground plane. In order to avoid the electric interaction of the structures 231, 232, . . . of the stub connected with the conduction band 211, slots 141, 142, . . . are left between them as shown in FIG. 6. When the adjoining parts 231, 232, . . . of the stub are approximately of equal length, which is generally the case, they can be merged without any considerable error to form a continuous structure according to FIG. 9, where number 13 is the resistor layer in question and number 12 is the insulation layer. In the shorted structure (FIG. 7) the resistor layer 13 crosses the edge of the insulation layer 12, and is thus electrically connected to the ground plane 221 as shown in the profile.

The accuracy of the line 230 of the resistor layer opposite to the driving point 211 of the stub can be increased by choosing more frequency points. This being done, the line acquires a more frequent stepping. When the stepping is frequent enough, it can be smoothed to form a curved line without error. The stub is trimmed by shortening it from its most recently added structure, which is 234 in the above example, so that the layer 13 is removed or cut, or the whole structure is cut, the cut being rectangular to and extending to the conductor 221 of the driving point, as shown in FIG. 11. When the resistor layer 13 of the stub is being removed with the $A_2O_3$-particles 5 of an air-abrasive trimmer 4, which is the most common trimming method of film resistors along with laser cutting, the admittance measured between the terminations of the stub changes along the line A as shown in FIG. 12. There is a definite difference between this and resistor trimming: in the latter the admittance moves along the real axis Re. In capacitor trimming, on the other hand, the admittance moves only along the imaginary axis Im. Thus it can be said that one measure carried out when shortening the stub corresponds to separate measures, that is, trimming both a resistor and a capacitor and these two even to the required magnitude. If it is desired to produce an admittance to be trimmed along the curve B, it is achieved by designing the form of the stub accordingly.

Figure 13:
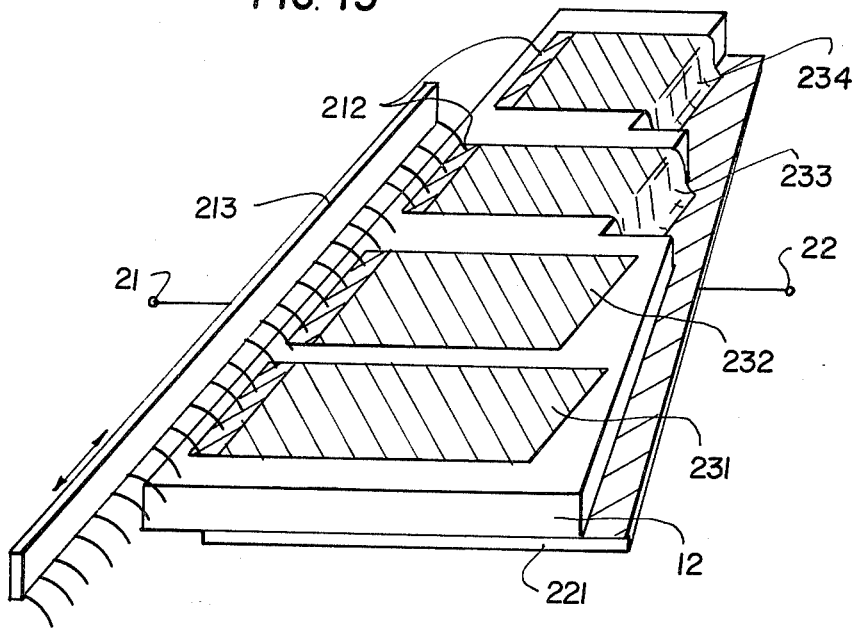
FIG. 13 is a perspective view of a readjustable stub.

The trimming can be made reversible with the arrangements of FIG. 13. The different parts 231, 232 etc.

of the stub are manufactured so that they will not interact electrically. In practice this means that the resistor layer 13 and the conduction band 212 of the driving point are disconnected between various parts (e.g. FIG. 6). The trimming or the connection of the parts of the required structure as well as the disconnection is carried out by employing the slide 213 for conducting electricity, which can be moved in parallel to the conductor band 212, the slide being duly propped up. By constructing this kind of a stub to form a circle, a potentiometer adjusting complex impedance will be obtained.

Figure 14:
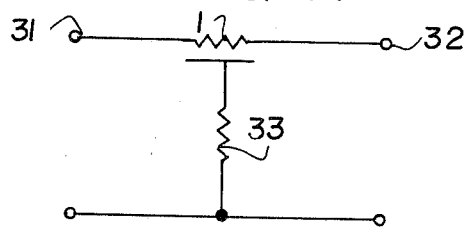
FIG. 14 is a circuit diagram of a bandrejection filter or a notch.

As the stub can be constructed so that its characteristic features do not change more than 0.1% along with the time and temperature, it can be used as a trimmable element in the construction of various circuits, such as oscillators, filters and attenuators. A bandrejection filter is presented in FIG. 14 as an application of this. The manufacturing of this filter has not succeeded in a satisfactory way, even though effects have been made since 1960. The reason for the failure has been the fact that it has not been possible to trim the stop frequency of the filter which is the characteristic most often required, only by changing the value of the resistor or the capacitor. This being the case, the stop frequency will depend on the manufacturing distribution of the distributed RC-structure 1.

Between the input 31 and the output 32 of the circuit, the transmission of the alternating current is completely hindered at the frequency 1.78/RC. Here R stand for the total resistance between the end conductors of the distributed RC-structure, while C represents the total capacitance of the insulation layer 12 between the ground plane 11 and the resistor layer 13, if the value of the resistor 33 equals exactly the value of the distributed resistance divided by 17.8. The problem is that then the rejection frequency has the same statistical divergence as the distributed RC-product, which in practice means that they are distributed within 5 to 20% on both sides of the desired value.

Figure 15:
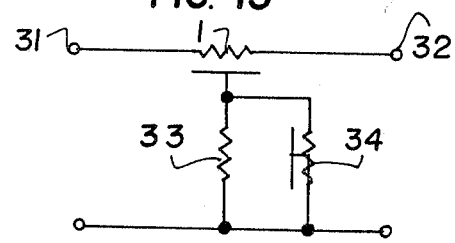
FIG. 15 is a circuit diagram showing the use of the stub for realizing a bandrejection filter.

However, the stop frequency of the circuit can be continuously adjusted by the capacitive-resistive admittance 34 placed parallel to the resistors 33 as shown in FIG. 15. By calculating values for this admittance corresponding various stop frequencies and realizing them by using a stub, a circuit is obtained, the stub frequency whereof can be trimmed by shortening the stub. The attenuation taking place in the stop frequency can be trimmed from the resistor 33. A series of circuits has been manufactured, in which the stop frequency whereof could be trimmed 28% in relation to the value 1.78/RC.

The above description in only one example of the adaptability and the use of the stub in trimming an electronic circuit. Electronic components of different kinds can be connected with the stub so that the desired trimming of the impedance (admittance) can be realized with the stub of the present invention. Thus the circuit can be modified with known components attached to the stub and other points of the circuit, in order to make the stub as suitable as possible for the required trimming of the circuit.

We claim:

1. An electric component with trimmable complex resistive-capacitive impedance comprising:
   a first resistor layer forming a ground plane;
   an insulation layer connected over said ground plane; and
   a second resistor layer connected connected over said insulation layer and divided into a plurality of resistor layer portions that are selectively connected and disconnected from each other to produce a selected resistive-capacitive impedance, the second resistor layer having a drive point conductor connected along one edge thereof and having an opposite edge which is step shaped to produce said resistor layer portions which have varied lengths and widths according to said step shaped edge.

2. An electric component according to claim 1, wherein at least one of said resistor layer portions is connected to said ground plane.

3. An electric component according to claim 1, wherein each of said resistor layer portions with an adjacent part of said insulation layer and said first resistor layer comprises an RC-structure having a particular admittance ($Y_1$) at a desired frequency ($f_1$) of alternating current, and another admittance ($Y'_2$) at another frequency ($f_2$), with the admittance ($Y'_2$) being smaller than a required admittance ($Y_2$), another of said resistor layer portions with adjacent insulation layer and first resistor layer forming another RC-structure of selected size connected in parallel to said first mentioned RC structure so as to eliminate the difference in admittances ($Y_2$-$Y'_2$).

4. An electric component according to claim 1, wherein said resistor layer portions are not connected to each other, said electric component including means for connecting a selected number of said resistor layer portions to produce a desired complex impedance.

5. An electric conductor according to claim 4, wherein said means comprise a contact portion connected to each of said resistor layer portions adjacent said second resistor layer one edge and a slide which is movable parallel to said contact portions to short a selected number of said contact portions to each other.

6. An electric component according to claim 1, including a ground resistor connected to said ground plane, at least one of said resistor layer portions including another contact connected thereto whereby a band rejection filter is formed.

7. An electric component according to claim 6, including a further first resistor layer with further insulation layer and further second resistor layer connected thereto having a further plurality of resistor layer portions to form a further electric component, at least one of said further resistor layer portions connected to said further first resistor layer, a further drive contact and additional contact connected across said at least one resistor layer portion, said further additional contacts connected in parallel to said ground resistor.

8. A method of preparing an electric component with trimmable complex resistive-capacitive impedance comprising:
   preparing an insulation layer having a lower first resistor layer and an upper second resistor layer, said second resistor layer having one edge adapted for receiving a drive conductor and an opposite edge having a step shape; and
   selectively dividing said second resistor layer into a plurality of resistor layer portions to produce a selected resistive-capactive impedance in the electric component.

9. A method according to claim 8, including providing said second resistor layer with a plurality of resistor layer which are each separated from each other;

providing each separated resistor layer portion with a conductor stip along one edge thereof, each conductor strip being parallel to each other conductor strip, each resistor layer portion with an adjacent part of said insulation layer and first resistor layer forming an RC-structure having a particular admittance ($Y_1$) at a desired frequency ($f_1$) of alternating current and another admittance ($Y'_2$) at another frequency ($f_2$), with the other admittance being smaller than a required admittance ($Y_2$), and connecting said one resistor layer portion to another resistor layer portion in order to eliminate said admittance difference.

10. A method according to claim 8, including reversibly connecting a plurality of said resistor layer portions to each other for selecting the complex impedance of the electric component.

* * * * *